(12) United States Patent
Senk et al.

(10) Patent No.: US 7,935,895 B2
(45) Date of Patent: May 3, 2011

(54) STRUCTURING AND CIRCUITIZING PRINTED CIRCUIT BOARD THROUGH-HOLES

(75) Inventors: David D. Senk, San Ramon, CA (US); Joe D. Dickson, Livermore, CA (US)

(73) Assignee: Cisco Technology, Inc., San Jose, CA (US)

(*) Notice: Subject to any disclaimer, the term of this patent is extended or adjusted under 35 U.S.C. 154(b) by 881 days.

(21) Appl. No.: 11/535,368

(22) Filed: Sep. 26, 2006

(65) Prior Publication Data
US 2008/0073113 A1 Mar. 27, 2008

(51) Int. Cl.
*H05K 1/11* (2006.01)
*H01K 3/10* (2006.01)
(52) U.S. Cl. .................. 174/262; 361/792; 29/852
(58) Field of Classification Search .......... 174/262–266; 361/792–795; 29/852–853
See application file for complete search history.

(56) References Cited

U.S. PATENT DOCUMENTS 5,310,986 A * 5/1994 Zumoto et al. ............. 219/121.7
6,388,208 B1 * 5/2002 Kiani et al. .................. 174/266

* cited by examiner

*Primary Examiner* — Jeremy C Norris
(74) *Attorney, Agent, or Firm* — P. Su

(57) ABSTRACT

Methods and apparatus for creating independent circuit connections within a through-hole of a substrate are described. According to one aspect of the present invention, a method includes defining a through-hole in a substrate, applying a conductive plating to a holewall of the through-hole, and selectively removing at least a first area of the plating. The through-hole has a height relative to a first axis, and the perimeter of the through-hole at each point along the first axis is approximately the same. Selectively removing the first area of the plating includes defining second areas of the plating. At least one of the plurality of second areas does not span a height of the hole.

21 Claims, 7 Drawing Sheets

STRUCTURING AND CIRCUITIZING PRINTED CIRCUIT BOARD THROUGH-HOLES

BACKGROUND OF THE INVENTION

1. Field of Invention

The present invention relates generally to the design and manufacturing of printed circuit boards. More particularly, the present invention relates to a plated through-hole that allows for multiple independent circuit connections to be made.

2. Description of the Related Art

Printed circuit boards are used in the formation of a wide variety of electrical devices. Typically, printed circuit boards include multiple layers of conductors, e.g., copper conductors, which are interconnected by metallized holes. Each metallized hole has plating that connects the layers of conductors exposed in the metallized hole to each other. For example, if three layers of a printed circuit board have conductors or traces through which the metallized hole passes, the three layers are interconnected. If a lead of an electrical component is inserted through a metallized hole, the plating in the metallized hole connects the layers of conductors exposed in the metallized hole to each other and to the electrical component.

As the circuit density on printed circuit boards increases, the need to efficiently utilize space on printed circuit boards is also increasing. Reducing the number of metallized holes in a printed circuit board will effectively free up the space on the printed circuit board for other purposes.

Using buried vias and backdrilling are methods which may allow the number of metallized holes used in a printed circuit board to be reduced. A buried via is generally a via that is embedded within a printed circuit board to connect a plurality of layers. Backdrilling allows plating of a metallized hole, e.g., stubs, to be removed such that the plating effectively terminates at a last conductive layer of a metallized hole. However, a buried via does not support more than one circuit connection therein, and backdrilling generally does not support more than one circuit connections in a metallized hole.

Therefore, what is needed is method and an apparatus that allows a metallized hole to support a plurality of independent circuit connections on different internal layers. That is, what is desired is a system which is suitable for providing multiple circuit connections or signal paths within a single, plated through-hole.

BRIEF DESCRIPTION OF THE DRAWINGS

The invention may best be understood by reference to the following description taken in conjunction with the accompanying drawings in which.

DESCRIPTION OF THE EXAMPLE EMBODIMENTS

The ability to provide a plurality of independent circuit connections within a single through-hole or via of a printed circuit board allows the layer count of the printed circuit board to be reduced, and enables routing and package density on the printed circuit board to be increased. Hence, a through-hole that has a plurality of independent circuit connections, or electrically isolated conductive segments, allows the cost of fabricating a printed circuit board to be reduced. Further, signal integrity associated with a printed circuit board that has such a through-hole may be improved, and the noise associated within the printed circuit board may be reduced by effectively removing unterminated plated stubs from the through-hole.

A plurality of independent circuit connections may be created in a through-hole, e.g., on a surface or holewall of the through-hole, by using laser machining or mechanical machining methods. That is, circuit patterns on a surface of a through-hole may be created using either laser etching or mechanical etching. Multilayer, dual through-hole connections will generally support parallel signal routing. Radially controlling the etching process, and controlling the etching process relative to a vertical axis, allows the circuit patterns created on the surface of the through-hole to be widely varied.

Figure 1:
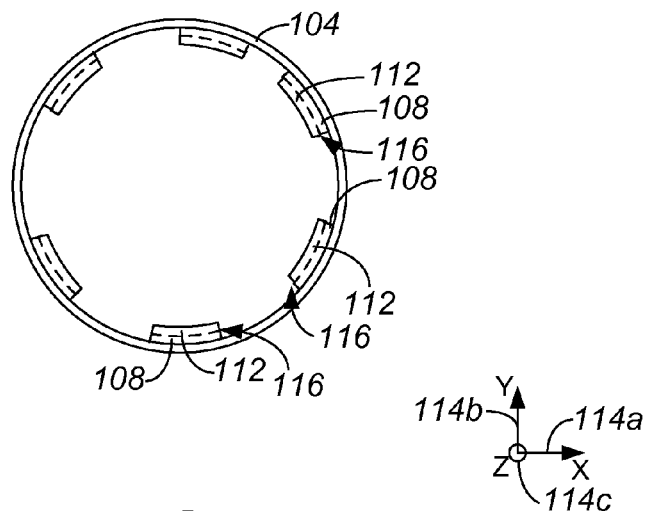
FIG. 1 is a diagrammatic top-view representation of a plated through-hole or via that includes a plurality of independent circuit connections in accordance with an embodiment of the present invention.

Independent circuit connections may be formed from plating or conductive material that is present on a surface of a through-hole. FIG. 1 is a diagrammatic top-view representation of a plated through-hole or via that includes a plurality of independent circuit connections in accordance with an embodiment of the present invention. A through-hole 100 includes a holewall 104 that is covered by a plating layer 108, i.e., a conductive layer. Holewall 104 effectively defines a perimeter of through-hole 100. Typically, holewall 104 has a substantially uniform perimeter, e.g., approximately the same perimeter at all heights along through-hole 100 relative to a Z-axis 114c. In the described embodiment, through-hole 100 has an approximately circular shape in a horizontal plane relative to an X-axis 114a and a Y-axis 114b. Hence, the diameter of through-hole 100 is approximately the same at all heights along through-hole 100 relative to Z-axis 114c.

Plating layer 108 may be formed from a conductive, metallized material such as copper. Although through-hole 100 is generally formed within a substrate, e.g., a printed circuit board, such that holewall 104 is part of the substrate, a substrate is not shown for ease of illustration. An etch resist layer 112 covers plating layer 108. Etch resist layer may be formed from a variety of different materials including, but not limited to, metallic materials, organic-photoimageable materials, and organic-on-photoimageable materials. Circuit connections 116 are formed from plating layer 108 and etch resist layer 112. It should be appreciated that etch resist layer 112 is typically significantly thinner than plating layer 108, though plating layer 108 is shown as being relatively thick for purposes of illustration. As shown, through-hole 100 includes multiple circuit connections 116.

In one embodiment, holewall 104 is initially covered with plating layer 108, and an etching process is used to remove portions (not shown) of plating layer 108 located where circuit connections 116 are not desired. That is, portions (not shown) of plating layer 108 that are not associated with circuit connections 116 are removed to define circuit connections 116.

Figure 2A:
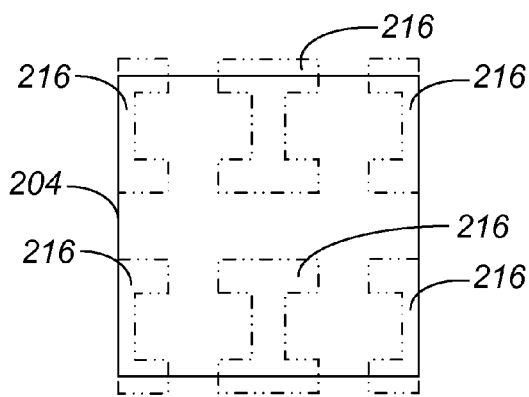
FIG. 2A is a diagrammatic cross-sectional side-view representation of a through-hole with independent circuit connections in accordance with an embodiment of the present invention.
Figure 2A:
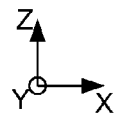

FIG. 2A is a diagrammatic cross-sectional side-view representation of a through-hole with electrically connected independent circuit connections in accordance with an embodiment of the present invention. In one embodiment, an electrically connected independent circuit connection is a metal circuit that connects two points, while an electrically isolated independent circuit connection is a metal connection between two points that is broken. A through-hole 200 includes a holewall 204 or a surface on which circuit connections 216 are formed. Circuit connections 216 may extend above holewall 204, as shown, and may have a variety of different shapes. Different shapes include, but are not limited to, polygonal shapes, spiral shapes used to form inductors, irregular shapes used to facilitate same-layer cross-overs, diagonals, and broken vertical circuits. Such different shapes, as well as other shapes, may generally be created by making both horizontal and vertical cuts.

Figure 2B:
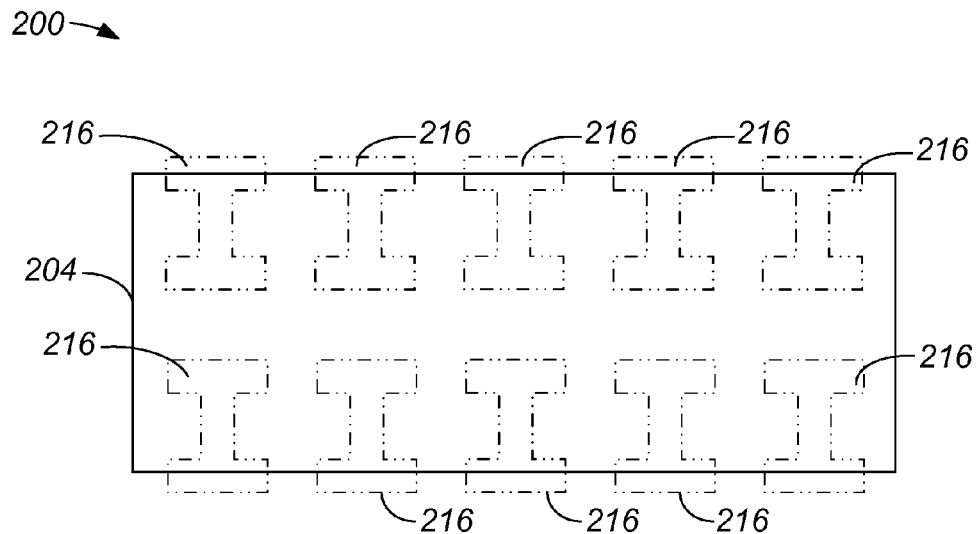
FIG. 2B is a diagrammatic planar, or unwrapped, representation of a through-hole with independent circuit connections, i.e., through-hole 200 of FIG. 2A, that are electrically connected in accordance with an embodiment of the present invention.

FIG. 2B is a projection or a transformation of an interior of through-hole 200, which is approximately cylindrically shaped, into a substantially flat, planar representation in accordance with an embodiment of the present invention. In other words, FIG. 2B is a planar representation of a surface of through-hole 200. Although circuit connections 216 are shown such that adjacent circuit connections 216 are relatively evenly spaced, the orientation and shape of circuit connections 216 may vary widely. In the described embodiment, each row of circuit connections 215 may be used to independently connect a circuit on one layer of a substrate (not shown) to a circuit on another layer of the substrate.

Figure 2C:
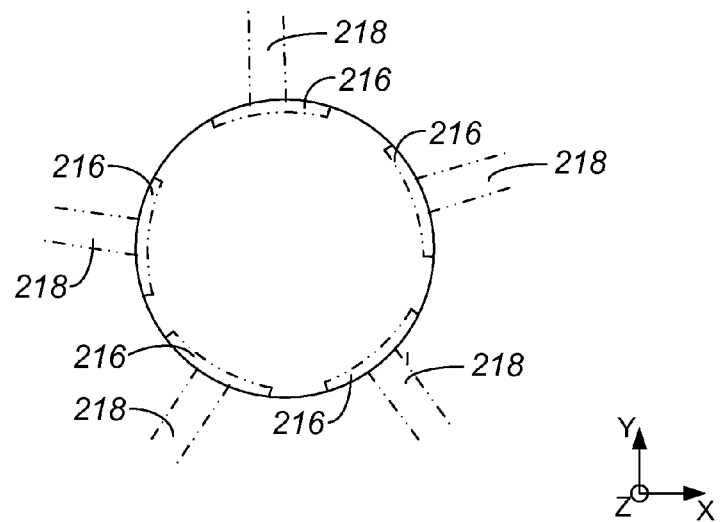
FIG. 2C is a diagrammatic top-view representation of a through-hole with independent circuit connections, i.e., through-hole 200 of FIG. 2A, to which traces are routed in accordance with an embodiment of the present invention.

Circuit connections 216 may be used to connect external traces (not shown) such that a signal on one trace may be provided to another trace via a circuit connection 216. As shown in FIG. 2C, traces 218 or conductors may be routed to circuit connections 216 in accordance with an embodiment of the present invention. Traces 218 abut against circuit connections 214, and are communicably coupled to circuit connections 214.

Figure 3:
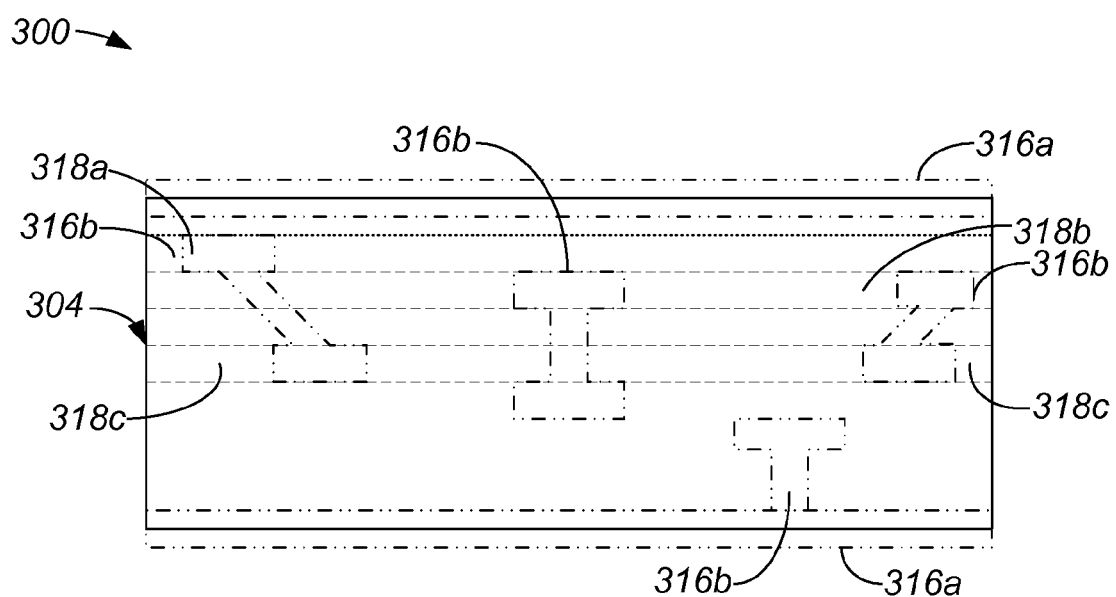
FIG. 3 is a diagrammatic planar, or unwrapped, representation of a through-hole with independent circuit connections that are electrically isolated in accordance with an embodiment of the present invention.

As previously mentioned, the pattern of circuit connections associated with a through-hole may vary. Referring next to FIG. 3, which is a substantially planar projection representation of a surface of a through-hole of a substrate, independent circuit connections that are electrically isolated will be described in accordance with an embodiment of the present invention. A through-hole 300 includes a holewall 304 onto which a plating layer and, hence, circuit connections 316a, 316b are formed. Circuit connections 316a are arranged to cover an edge perimeter or an edge circumference of holewall 304, while circuit connections 316b may be positioned on holewall 304 in positions that enable traces (not shown) to be efficiently routed to circuit connections 316b. Circuit connections 316a may each enable a connector (not shown) of an electrical component, e.g., an integrated circuit chip, to be inserted at least partially into through-hole 300 such that any traces (not shown) that are communicably coupled to a circuit connection 316a are also coupled to a connector. Hence, through-hole 300 may support an electrical component (not shown) on each end. The shapes and sizes of circuit connections 316b may vary widely. In one embodiment, independent circuit connections 316a, 316b may be considered to be electrically isolated because there is not a direct metal path between two points.

Each circuit connection 316b may allow circuits or traces on at least two layers of a multi-layer substrate, e.g., a printed circuit board, to be communicably, e.g., electrically, connected. For instance, layers 318a, 318c may be interconnected by one circuit connection 316b, and layers 318b, 318c may be interconnected by another circuit connection 316b. That is, different conductive layers 318a-c may be interconnected by circuit connections 316b. It should be appreciated that more than two layers may be interconnected by a single circuit connection 316b.

Figure 4A:
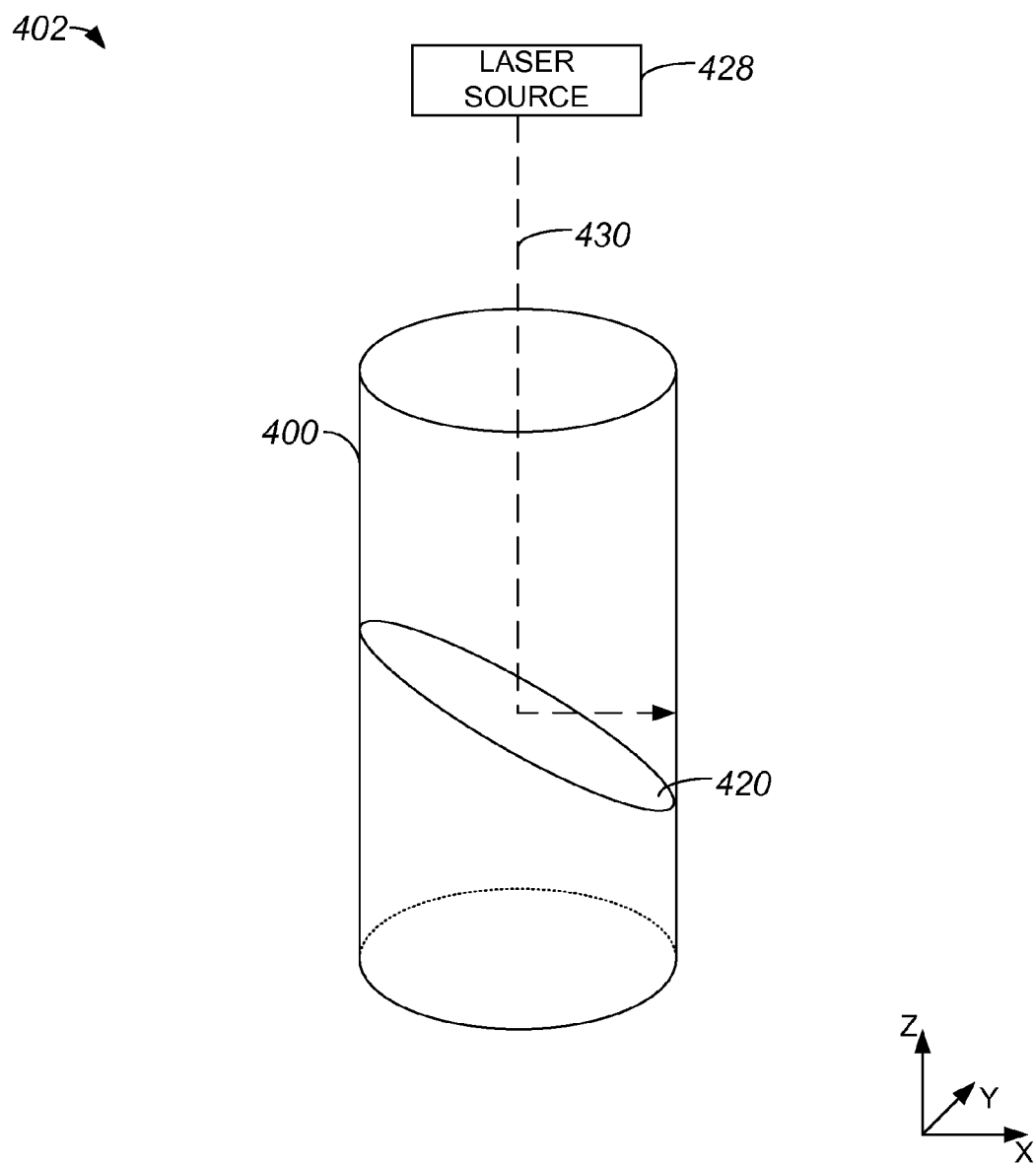
FIG. 4A is a diagrammatic representation of a system which uses a laser in conjunction with a mirror to form independent circuit connections within a through-hole in accordance with an embodiment of the present invention.

Independent circuit connections on a surface of a through-hole may be formed, in one embodiment, using a laser. A laser may be used to essentially cut away portions of a plating layer through approximately the full thickness of the plating layer on a holewall, or through any applied etch resist, e.g., with or without at least partial penetration into the plating layer, such that underlying plating may be subsequently removed using a wet chemical etching process to define circuit connections. With reference to FIG. 4A, a system which uses a laser in conjunction with a mirror to form independent circuit connections within a through-hole will be described in accordance with an embodiment of the present invention. A system 402 includes a through-hole 400 into which cutting optics 420 are positioned. Cutting optics 420 may include a reflective surface such as a mirror. Cutting optics 420 may be positioned within through-hole 400 at an angle, e.g., at an approximately 45 degree angle relative to a horizontal axis.

Figure 4B:
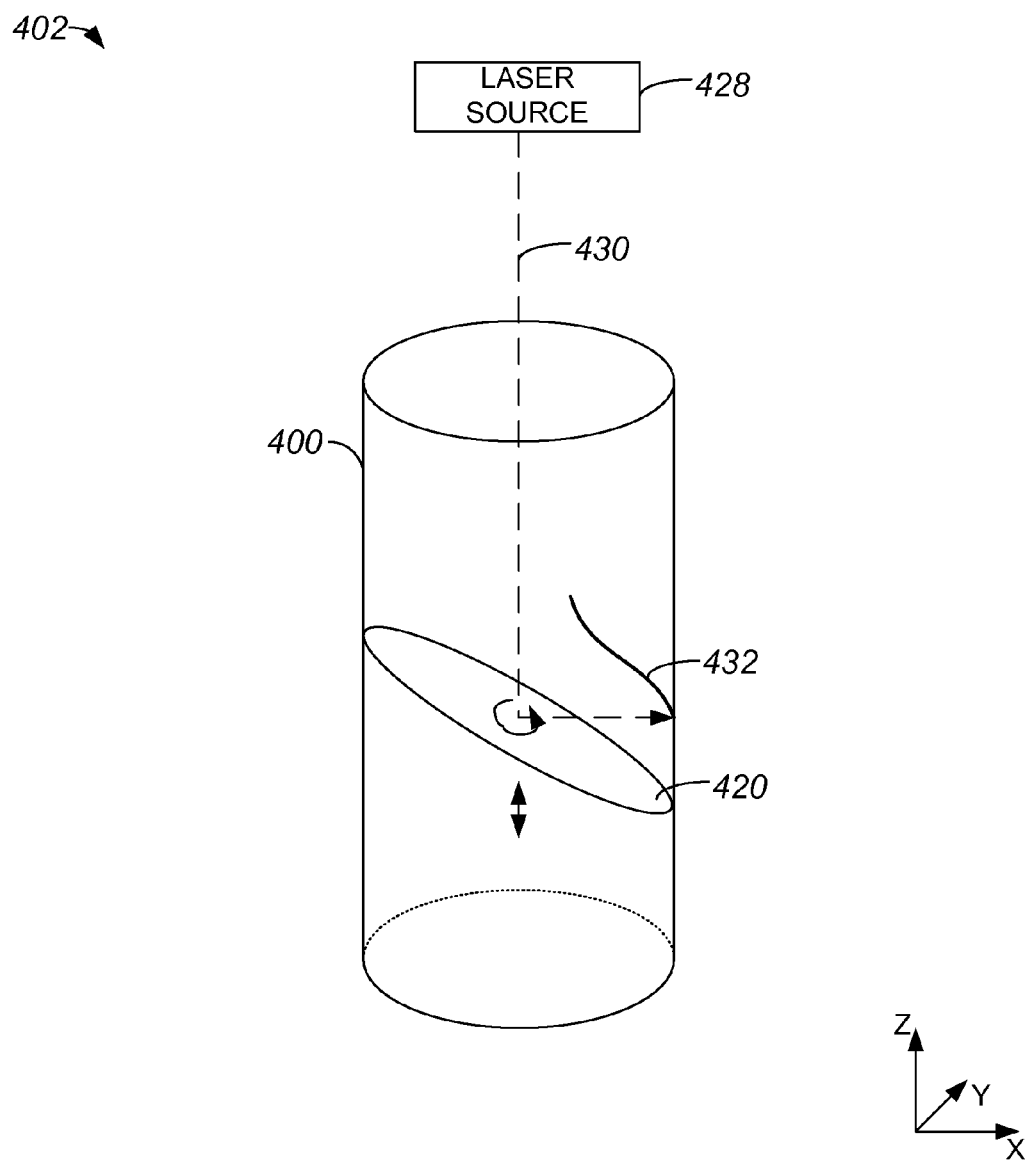
FIG. 4B is a diagrammatic representation of a through-hole, e.g., through-hole 400 of FIG. 4A, in which a pattern has been formed using a laser in accordance with an embodiment of the present invention.

A laser source 428 provides a laser beam 430 that reflects off of cutting optics 420 and onto a surface of through-hole 420. By adjusting a vertical position of cutting optics 420, or by rotating cutting optics 420, the reflection of laser beam 430 off of cutting optics 420 may be controlled. In other words, cutting optics 420 may be moved both vertically and radially to create a circuit pattern (not shown) onto a holewall of through-hole 420. As shown in FIG. 4B, adjusting the position of cutting optics 420 within through-hole 420 allows a pattern 432 to be etched onto the surface of through-hole 420. Laser beam 430 may etch away portions of a plating layer, as well as etch resist, such that pattern 432 may define circuit connections on the surface of through-hole 420. Typically, laser beam 430 does not etch away any portion of through-hole 420 aside from the plating layer and the etch resist. Hence, the physical structure of the holewall of through-hole 420 is not altered when circuit connections are defined.

Figure 5A:
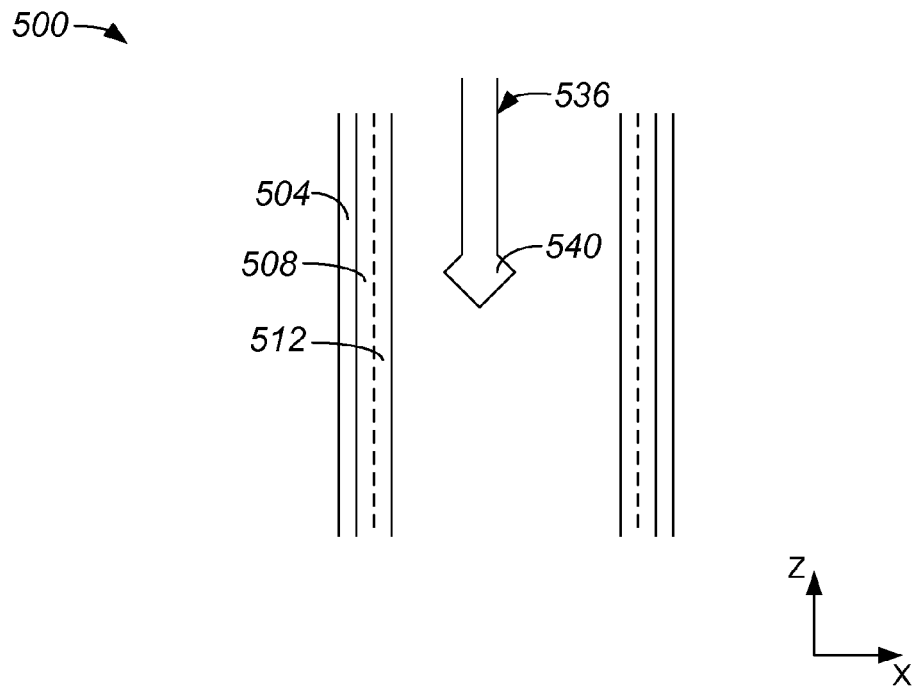
FIG. 5A is a diagrammatic cross-sectional side-view representation of a through-hole within which a mechanical router that is arranged to be used to create independent circuit connections is positioned in accordance with an embodiment of the present invention.

In lieu of using a laser to form circuit connections within a through-hole, a mechanical milling or routing process may be used. For example, a mechanical router may be used to form circuit connections. FIG. 5A is a diagrammatic cross-sectional side-view representation of a through-hole within which a mechanical router that is arranged to be used to create independent circuit connections is positioned in accordance with an embodiment of the present invention. A through-hole 500 has a holewall 504, a plating layer 508, and an etch resist layer 512. A mechanical router bit 536 with a cutting head 540 is positioned such that at least a portion of cutting head or tip 540 is located within through-hole 500. Router bit 536, which is generally coupled to a router driver (not shown) that allows router bit 536 to translate and to rotate, has a diameter that is substantially less than a diameter of through-hole 500. Router bit 536 is arranged to rotate about its own axis, and also to follow along the contour of the holewall of through-hole 500.

Figure 5B:
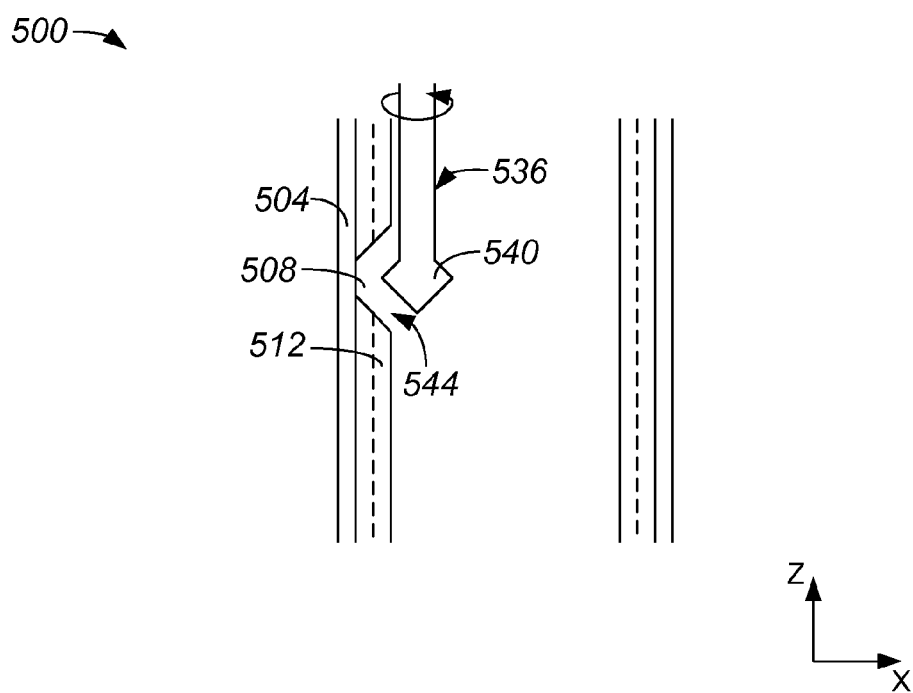
FIG. 5B is a diagrammatic cross-sectional side-view representation of a through-hole, e.g., through-hole 500 of FIG. 5A, in which a portion of a plating layer, e.g., plating layer 508 of FIG. 5A, is exposed in accordance with an embodiment of the present invention.

As shown in FIG. 5B, cutting head 540 may be used to cut away or to route away a portion of etch resist layer 512 and a portion of plating layer 508 to define a gap 544 between plated areas. In other words, cutting head 540 may be used to define circuit connections within through-hole 500 by cutting away, routing away, grinding away, and/or abrading away unwanted portions of plating layer 508 and etch resist layer 512.

Figure 6:
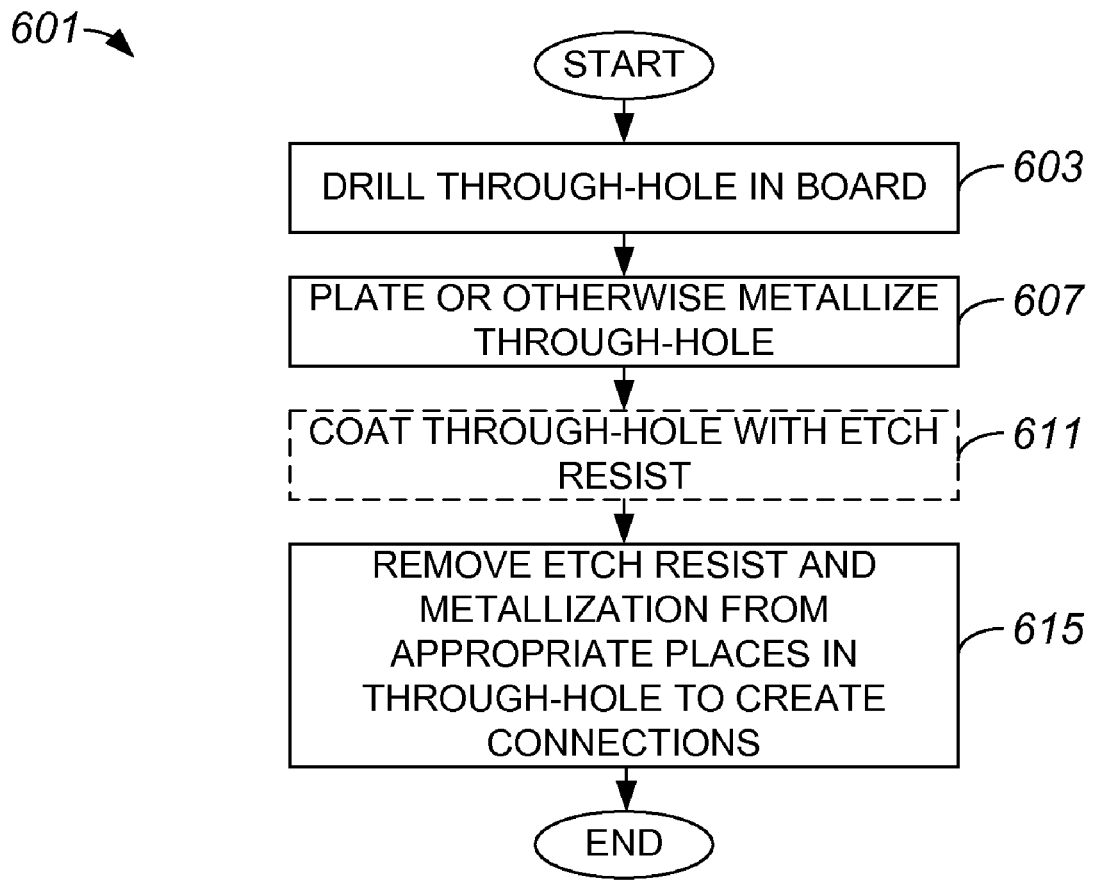
FIG. 6 is a process flow diagram which illustrates a method or structuring and circuitizing a through-hole of a printed circuit board in accordance with an embodiment of the present invention.

FIG. 6 is a process flow diagram which illustrates a method or structuring and circuitizing a through-hole of a board in accordance with an embodiment of the present invention. A process 601 of structuring and circuitizing a through-hole begins at step 603 in which a through-hole is drilled, or otherwise formed, in the board. While the through-hole may commence at a top surface, or a surface layer, of the board and end at a bottom surface, or a surface layer, of the board, it should be appreciated that the through-hole may instead begin or terminate within the board, e.g., the through-hole may be a blind via or a buried via.

After the through-hole is drilled, the surface of the through-hole is plated or otherwise metallized in step 607. The through-hole may be plated using an electroplating process. In one embodiment, the through-hole is plated with copper. Once the through-hole is plated, the surface is coated with etch resist in step 611. It should be appreciated that coating the surface with etch resist is optional. Then, in step 615, the etch resist and the plating are removed from appropriate places in the through-hole such that connections are created. As previously mentioned, methods used to remove etch resist may include laser machining and mechanical routing. Upon creating connections, the process of structuring and circuitizing a through-hole is completed.

Although only a few embodiments of the present invention have been described, it should be understood that the present invention may be embodied in many other specific forms without departing from the spirit or the scope of the present invention. By way of example, in a system which uses laser etching to define circuit connections, the angle at which the cutting optics may be changed in lieu of, or in addition to, radially or vertically moving the cutting optics.

While through-holes or vias have generally been described as including a plurality of substantially independent circuit connections, the configuration of the through-holes may vary. For instance, through-holes which have a plurality of substantially independent circuit connections may include, but are not limited to including, microvias, buried vias, and blind vias. In addition, substantially any metallized hole or opening may include a plurality of substantially independent circuit connections.

Methods used to create patterns such as substantially independent circuit patterns are not limited to the use or laser etching or mechanical etching. For example, as previously mentioned, exposure methods or chemical etching methods may be used to create patterns within a through-hole. In one embodiment, a mask that defines patterns may be used in conjunction with exposure methods or chemical etching methods.

A through-hole has generally been described as being approximately cylindrically shaped. However, the overall shape of a through-hole may vary. For instance, through-holes may have cross-sections relative to an XY-plane that are approximately ovular, approximately polygonal, or irregularly shaped. Hence, a through-hole may have a variety of different three-dimensional shapes.

In general, circuit connections are such that they span a subset of layers penetrated by a through-hole, e.g., as shown in FIG. 3, and not an entire height of the through-hole. That is, a circuit connection on a holewall of a through-hole typically effectively contacts some, but not all, layers of a printed circuit board that are passed through by a through-hole. It should be understood that a circuit connection may contact a layer, but will not be communicably coupled to that layer unless there is a conductive circuit or trace on that layer. However, in some cases, a circuit connection may be arranged to span substantially all layers associated with a printed circuit board.

Independent circuit connections may be formed, in one embodiment, by circumferentially cutting away portions of a plating layer. In other words, a plurality of rings of plating on the holewall of a through-hole may be formed using horizontal cuts such that a through-hole is effectively split into at least two plated sections.

The steps associated with the methods of the present invention may vary widely. Steps may be added, removed, altered, combined, and reordered without departing from the spirit of the scope of the present invention. For example, in lieu of coating a through-hole with etch resist, ablation may be used to remove plating from a through-hole such that the remaining plating forms circuit connections. Therefore, the present examples are to be considered as illustrative and not restrictive, and the invention is not to be limited to the details given herein, but may be modified within the scope of the appended claims.

What is claimed is:

1. A method comprising:
   defining a through-hole in a substrate, the through-hole having a holewall and a height with respect to a first axis, wherein the holewall has an approximately uniform perimeter at each location along the height;
   applying a plating to the holewall, the plating being conductive; and
   selectively removing at least a first area of the plating, selectively removing at least the first area of the plating including defining a plurality of second areas of the plating, the plurality of second areas of the plating not being communicably coupled to each other, wherein at least one of the plurality of second areas does not span the height of the through-hole.

2. The method of claim 1 wherein selectively removing at least the first area of the plating includes removing at least the first area of the plating using a laser.

3. The method of claim 2 wherein removing at least the first area of the plating using a laser includes:
   positioning an optical surface within the through-hole; and
   reflecting the laser off of the optical surface and onto at least the first area of the plating to remove at least the first area of the plating.

4. The method of claim 3 further including moving the optical surface within the through-hole.

5. The method of claim 1 wherein selectively removing at least the first area of the plating includes removing at least the first area of the plating using a mechanical router.

6. The method of claim 5 wherein removing at least the first area of the plating using a mechanical router includes:
   positioning a routing tip of the mechanical router within the through-hole;
   placing the routing tip in contact with at least the first area of the plating; and
   operating the routing tip to grind away at least the first area of the plating.

7. The method of claim 1 wherein the plurality of second areas are a plurality of circuit connections.

8. The method of claim 1 further including:
   applying etch resist over the plating, wherein selectively removing at least the first area of the plating includes selectively removing the etch resist.

9. The method of claim 1 wherein the plating is copper.

10. A system comprising:
    means for defining a through-hole in a substrate, the through-hole having a holewall and a height with respect to a first axis, wherein the holewall has an approximately uniform perimeter at each location along the height;
    means for applying a plating to the holewall, the plating being conductive; and
    means for selectively removing at least a first area of the plating, the means for selectively removing at least the first area of the plating including means for defining a plurality of second areas of the plating, the plurality of second areas of the plating not being communicably coupled to each other, wherein the means for selectively removing at least the first area of the plating do not remove a part of the substrate.

11. A substrate comprising:
    a plurality of layers;
    a first conductive trace, the first conductive trace being a first circuit;
    a second conductive trace, the second conductive trace being a second circuit;
    a third conductive trace, the third conductive trace being a third circuit;
    a fourth conductive trace, the fourth conductive trace being a fourth circuit; and
    an opening, the opening passing through the plurality of layers and having a holewall, the holewall having a perimeter that is approximately the same relative to each layer of the plurality of layers, wherein a first circuit connection and a second circuit connection are formed on the holewall such that the first circuit connection does not contact every layer of the plurality of layers, the first circuit connection being arranged to communicably couple the first conductive trace to the second conductive trace, the second circuit connection being arranged to communicably couple the third conductive trace to the fourth conductive trace, and wherein the first conductive trace is electrically isolated from the third conductive trace.

12. The substrate of claim 11 wherein the substrate is a printed circuit board, the first conductive trace being included on a first layer of the plurality of layers, the second conductive trace being included on a second layer of the plurality of layers, the third conductive trace being included on a third layer of the plurality of layers, the fourth conductive trace being included on a fourth layer of the plurality of layers.

13. The substrate of claim 11 wherein the substrate is a printed circuit board, the first conductive trace being included on a first layer of the plurality of layers, the second conductive trace being included on a second layer of the plurality of layers, the third conductive trace being included on the second layer of the plurality of layers, the fourth conductive trace being included on a first layer of the plurality of layers.

14. The substrate of claim 11 wherein the substrate is a printed circuit board, the first conductive trace being included on a first layer of the plurality of layers, the second conductive trace being included on a second layer of the plurality of layers, the third conductive trace being included on a third layer of the plurality of layers, the fourth conductive trace being included on the second layer of the plurality of layers.

15. The substrate of claim 11 further including:
    a third circuit connection, wherein the third circuit connection is independent from the first circuit connection and the second circuit connection.

16. The substrate of claim 11 wherein the substrate is a printed circuit board, and the opening is one selected from the group including a microvia, a buried via, and a blind via.

17. The substrate of claim 11 wherein the first conductive trace is one selected from a group including a spirally shaped trace, a polygonally shaped trace, and a diagonally shaped trace.

18. A printed circuit board comprising:
    a plurality of layers, the plurality of layers including a first layer, and a second layer, and a third layer; and
    a through-hole, the through-hole being arranged to span the plurality of layers and including a plurality of independent circuit connections, the plurality of independent circuit connections including a first independent circuit connection and a second independent circuit connection, the first independent circuit connection and the second independent circuit connection each being arranged to span the first layer and the second layer but not the third layer.

19. The printed circuit board of claim 18 wherein the through-hole is one selected from the group including a microvia, a buried via, and a blind via.

20. The printed circuit board of claim 18 wherein the through-hole has a perimeter.

21. The printed circuit board of claim 20 wherein the first independent circuit connection spans the perimeter.

\* \* \* \* \*